(12) United States Patent
Vissiere et al.

(10) Patent No.: US 10,996,288 B2
(45) Date of Patent: May 4, 2021

(54) METHOD FOR CALIBRATING A MAGNETOMETER

(71) Applicant: SYSNAV, Vernon (FR)

(72) Inventors: David Vissiere, Paris (FR); Charles-Ivan Chesneau, Paris (FR); Mathieu Hillion, Vernon (FR); Hendrik Meier, Vernon (FR)

(73) Assignee: SYSNAV, Vernon (FR)

( * ) Notice: Subject to any disclaimer, the term of this patent is extended or adjusted under 35 U.S.C. 154(b) by 0 days.

(21) Appl. No.: 16/633,147

(22) PCT Filed: Jul. 26, 2018

(86) PCT No.: PCT/FR2018/051929
§ 371 (c)(1),
(2) Date: Jan. 22, 2020

(87) PCT Pub. No.: WO2019/020955
PCT Pub. Date: Jan. 31, 2019

(65) Prior Publication Data
US 2020/0200835 A1    Jun. 25, 2020

(30) Foreign Application Priority Data
Jul. 26, 2017   (FR) ...................................... 1757084

(51) Int. Cl.
*G01R 33/00* (2006.01)
*G01R 33/02* (2006.01)
(52) U.S. Cl.
CPC ..... *G01R 33/0035* (2013.01); *G01R 33/0017* (2013.01); *G01R 33/02* (2013.01)
(58) Field of Classification Search
CPC . G01R 33/0017; G01R 33/02; G01R 33/0041
See application file for complete search history.

(56) References Cited

U.S. PATENT DOCUMENTS 6,242,907 B1   6/2001 Clymer et al.
2010/0307016 A1  12/2010 Mayor et al.
(Continued)

FOREIGN PATENT DOCUMENTS

EP   1803413 A2   7/2007
EP   2685273 A1   1/2014

OTHER PUBLICATIONS

International Preliminary Report on Patentability received for PCT Patent Application No. PCT/FR2018/051929, dated Feb. 6, 2020, 31 pages (18 pages of English Translation and 13 pages of Original Document).
(Continued)

*Primary Examiner* — Alvaro E Fortich
(74) *Attorney, Agent, or Firm* — Womble Bond Dickinson (US) LLP (57) ABSTRACT

The present invention relates to a method for calibrating a magnetometer (3) in which the magnetometer (3) is arranged inside the windings (21) of a generator (2), a magnetic field being generated by the generator (2), a series of measurements of the magnetic field with the magnetometer (3) being carried out by varying the position of the magnetometer (3) and/or the electric currents in the windings (21) between each measurement, the electric currents applied in the windings (21) also being measured, a parametric transfer model being generated from a parametric measurement model of the magnetometer including parameters for calibrating the magnetometer and a parametric model of the magnetic field, the parameters for calibrating the magnetometer (3) being calculated by an optimisation algorithm from the parametric transfer model and measurements of the magnetic field by the magnetometer and measurements of the currents in the windings.

13 Claims, 3 Drawing Sheets

(56) References Cited

U.S. PATENT DOCUMENTS

| | | | |
|---|---|---|---|
| 2011/0084692 A1 | 4/2011 | Billeres et al. | |
| 2015/0019159 A1* | 1/2015 | Elgersma | G01R 35/005 |
| | | | 702/150 |
| 2016/0041234 A1* | 2/2016 | Li | G01V 13/00 |
| | | | 324/202 |
| 2017/0067981 A1 | 3/2017 | Hannah et al. | |
| 2017/0115364 A1 | 4/2017 | Efrat et al. | |
| 2017/0123035 A1* | 5/2017 | Clark | B64C 39/024 |
| 2018/0299513 A1* | 10/2018 | Dusha | E02F 9/264 |

OTHER PUBLICATIONS

International Search Report and Written Opinion received for PCT Patent Application No. PCT/FR2018/051929, dated Oct. 1, 2018, 35 pages (19 pages of English Translation and 16 pages of Original Document).

Preliminary Research Report received for French Application No. 1757084, dated Jun. 18, 2018, 5 pages (1 page of French Translation Cover Sheet and 4 pages of original document).

Zhang, Zhi-Qiang, "Two-Step Calibration Methods for Miniature Inertial and Magnetic Sensor Units", IEEE Transactions on Industrial Electronics, vol. 62, No. 6, Jun. 2015, pp. 3714-3723.

\* cited by examiner

METHOD FOR CALIBRATING A MAGNETOMETER

GENERAL TECHNICAL FIELD

The present invention relates to the field of the calibration of sensors.

More precisely, it relates to a method for calibrating at least one magnetometer.

A magnetometer may be used for various applications, such as for example navigation without GPS, or the detection of metals.

PRIOR ART

The magnetic field is a vector field in three-dimensional space, that is to say associating a magnetic field vector noted $\vec{B}$ of three dimensions with each location in space. The magnetic field at a point is thereby characterised by its norm and its direction.

A magnetometer makes it possible to measure the magnetic field at a point. A magnetometer may be a monoaxial magnetometer, capable of measuring a component of the magnetic field in a position, i.e. the projection of the magnetic field vector $\vec{B}$ at the level of said magnetometer along its axis. A magnetometer may also be a triaxial magnetometer, capable of measuring the magnetic field along its three axes, which may be constituted of three monoaxial magnetometers rigidly connected together and oriented along different axes, generally substantially orthogonal.

However, the measurement of the magnetic field by a magnetometer is not perfect, such that the measurement of the magnetic field deviates from the real magnetic field. For example, hard iron effects may be created by remanence of certain components with strong magnetic fields and lead to measurement biases. Scale factors may also distort the measurement. Furthermore, effects due to the physical configuration of the magnetometer and to the mounting of the magnetometer can also affect the measurement.

It is possible for example to express the measurement of a triaxial magnetometer in the following linear form:

$$\vec{B}_m = D\vec{B} + \vec{b}$$

where $\vec{B}_m$ is the measurement of the magnetic field by the magnetometer, $\vec{B}$ is the real magnetic field, D is a scale factor (represented by a diagonal or full matrix), and $\vec{b}$ is a measurement bias. The scale factor and the measurement bias are thus measurement parameters that pollute the measurement of the magnetic field with respect to the real magnetic field. It is thus advisable to estimate these parameters, or at least one, in order to be able to correct the measurement of the magnetic field.

The calibration of a magnetometer comes down to determining at least one of these parameters and deducing therefrom the corrections to make to the magnetometer outputs in order that the corrected measurement reflects more faithfully the real magnetic field.

In addition, calibration makes it possible to determine the position of the magnetometer in a point of reference linked to the support on which said magnetometer is (the orientation of the magnetometer and its location in space).

A precise calibration of the magnetometer is notably required for applications that require great precision. In particular, a magneto-inertial unit may include, apart from accelerometers, a network of several magnetometers arranged at different locations which enable the simultaneous estimation of the field and the magnetic gradient. The precision of these measurements is essential for the correct performance of reconstruction of the movement of the magneto-inertial unit.

An existing calibration method, called "free field method", consists in placing the magnetometers to calibrate in a place as far away as possible from any source of magnetic disturbances. This method is very restrictive because places far away from magnetic disturbances are very remote. In addition, the conditions for isolating any source of magnetic disturbances are more and more compromised by various human constructions.

Another known calibration method uses Helmholtz, Braunbek, or other types of coils. This solution requires however carrying out beforehand a standardisation of the coils with a standard magnetometer. A large part of the precision of the calibration of magnetometers depends on this step of standardisation of the coils which on the one hand is complex and on the other hand requires great precision. In addition, in order to obtain the desired precision, it may then also be necessary to calibrate the control magnetometer, complexifying and lengthening by as much the calibration method.

Moreover, certain known calibration methods using Helmholtz coils necessitate placing the magnetometers to calibrate in a zone in which a homogeneous magnetic field is created by the Helmholtz coils. Such a method is for example described in the document US2017/0067981. Such a method has the drawback that it becomes necessary to use coils with a very significant radius to be able to calibrate certain objects, which poses problems of bulk. Indeed, the magnetometers to calibrate must be situated in the zone in which the magnetic field created by the Helmholtz coils is homogeneous, and the size of this zone in which the magnetic field is homogeneous depends on the size of the Helmholtz coils. Yet, magnetometers are calibrated while being mounted on a support, such as an electronic card for example, which is generally arranged in an object, such as a case for example, because the object and the support may interfere with the measurement of the magnetic field by the magnetometers. The zone in which the magnetic field is homogeneous must be sufficiently large in order to be able to contain the object.

It would thus be desirable to have available a new method for calibrating a magnetometer which is at one and the same time precise and simple to implement, and which does not need to be carried out at a place distant from any source of magnetic disturbances.

DESCRIPTION OF THE INVENTION

The present invention thus relates, according to a first aspect, to a method for calibrating a magnetometer, the method being characterised in that it includes the following steps:

E1: placing at least one magnetometer inside a generator of a magnetic field, said generator including a plurality of windings;

E2: generating a magnetic field in the generator by applying an electric current to each winding;

E3: measuring the magnetic field generated in the generator with the at least one magnetometer, and measuring the electric currents applied to the windings of the generator;

E4: repeating step E3 by modifying each time a position of said at least one magnetometer inside the generator and/or the electric currents in the windings of the generator, so as to obtain measurements of the magnetic field and the electric currents applied to the windings for a plurality of positions of said at least one magnetometer and/or electric currents in the windings;

E5: generating a parametric transfer model from a parametric measurement model of said at least one magnetometer and a parametric model of the magnetic field, the parametric measurement model of said at least one magnetometer including parameters for calibrating said at least one magnetometer;

E6: calculating the parameters for calibrating the at least one magnetometer with an optimisation algorithm from the parametric transfer model generated at step E5 and measurements of the magnetic field and the electric currents carried out in steps E3 and E4.

According to other advantageous and non-limiting characteristics:

the method includes the following step:

E40: calculating a measured transfer model between the measurement of the magnetic field by the at least one magnetometer and the electric currents applied to the windings for the different positions of said at least one magnetometer and/or the different electric currents in the windings, from on the one hand measurements of said magnetic field and on the other hand measurements of said electric currents applied to the windings, the calculation of the calibration parameters being carried out with an optimisation algorithm from the parametric transfer model and the measured transfer models;

the method further includes a step of controlling the temperature of said at least one magnetometer to calibrate;

the at least one magnetometer has a linear response, the measured transfer model being a measured transfer matrix which is calculated by linear regression, the parametric transfer model being a parametric transfer matrix;

the at least one magnetometer has a non-linear response, the measured transfer model being calculated with a polynomial model or a Fourier series model;

the generator is a device with triaxial Helmholtz coils including six windings;

the method includes a step of identification of a bias of said at least one magnetometer, the identification step being carried out by placing said at least one magnetometer in a device isolating said at least one magnetometer from any magnetic field;

the method is applied to a plurality of magnetometers, the parameters for calibrating the magnetometers including a defined location of the magnetometers with respect to one of the magnetometers serving as reference;

the at least one magnetometer is maintained fixed during step E2 of generation of the magnetic field inside the generator and during step E3 of measurement of the magnetic field and the electric current applied to each of the windings;

the parameters for calibrating the at least one magnetometer include: a position of said at least one magnetometer on a support on which said at least one magnetometer is mounted, a directional measurement factor of said at least one magnetometer, and/or a bias of said at least one magnetometer;

the parametric model of the magnetic field is a first order field model, second order field model, or a fine elements model.

According to a second aspect, the invention relates to an equipment for calibrating at least one magnetometer including at least a magnetometer, a generator of a magnetic field which includes a plurality of windings, characterised in that it also includes a current sensor configured to measure the current in each of the windings, and processing means which are configured to:

generate a parametric transfer model from a parametric measurement model of said at least one magnetometer and a parametric model of the magnetic field, the parametric measurement model of said at least one magnetometer including parameters for calibrating said at least one magnetometer;

calculate the parameters for calibrating the at least one magnetometer with an optimisation algorithm from the parametric transfer model and measurements of the magnetic field by said at least one magnetometer and measurements of the currents in the windings.

According to another advantageous and non-limiting characteristic, the generator is a device with triaxial Helmholtz coils including six windings.

According to a third aspect, the invention relates to a computer programme product including code instructions for the execution of a method for calibrating at least one magnetometer according to the first aspect of the invention.

According to a fourth aspect, the invention relates to a storage means so readable by a computer equipment on which a computer programme product includes code instructions for the execution of a method for calibrating at least one magnetometer according to the first aspect of the invention.

An aim of the invention is to simplify the calibration of a magnetometer, notably by determination of the directional measurement factor of the magnetometer, its bias, and/or its location on a support.

Another aim of the invention is to calibrate in a simultaneous manner a magnetometer and a parametric model of the magnetic field.

Another aim of the invention is to be able to standardise or optimise current calibration systems.

DESCRIPTION OF THE FIGURES

Other characteristics and advantages of the present invention will become clear on reading the description that follows of a preferential embodiment. This description will be given with reference to the appended drawings in which.

DETAILED DESCRIPTION

Principle

The present method proposes using a magnetic field generator, such as for example a device with Helmholtz, Braunbek or Maxwell coils.

In addition, the method proposes, instead of calibrating the generator then calibrating the magnetometers, simultaneously calibrating the magnetometers and the generator.

An aspect of the invention is based on the fact that it is possible to:

determine parameters for calibrating magnetometers, notably a location and an orientation of the magnetometers on the support on which said so magnetometers are mounted, a directional measurement factor, and a bias; and determine the parameters of the magnetic field model generated by the generator by use of an optimisation algorithm between the measurements of the magnetic field generated by the generator carried out by the magnetometers to calibrate and a parametric measurement model, said parametric measurement model being based on a parametric model of the magnetic field and on a parametric measurement model of the magnetometer which includes the parameters for calibrating said magnetometer.

There is thus no need to know the magnetic field generated by the generator, as is the case in known calibration methods in which the generator is calibrated in order to know precisely the properties of the magnetic field generated by said generator. In this aspect of the invention, it suffices to use a parametric model of the magnetic field that is chosen by the user without taking into account the parameters of the magnetic field that the generator really generates.

The measurements of the magnetic field of the generator are carried out by varying the position of the magnetometers inside the generator.

Apart from the parameters for calibrating the magnetometer, this solution may further make it possible to determine the parameters of the parametric model of the magnetic field.

Position is herein taken to mean the combination of a location and an orientation, which makes it possible to describe completely the spatial configuration of an object. In a vector write of a space with three dimensions, the location is defined by a vector with three components (the spatial coordinates in a point of reference), and the orientation is also defined by a vector with three components (the angles of rotation with respect to the point of reference).

Equipment

Figure 1:
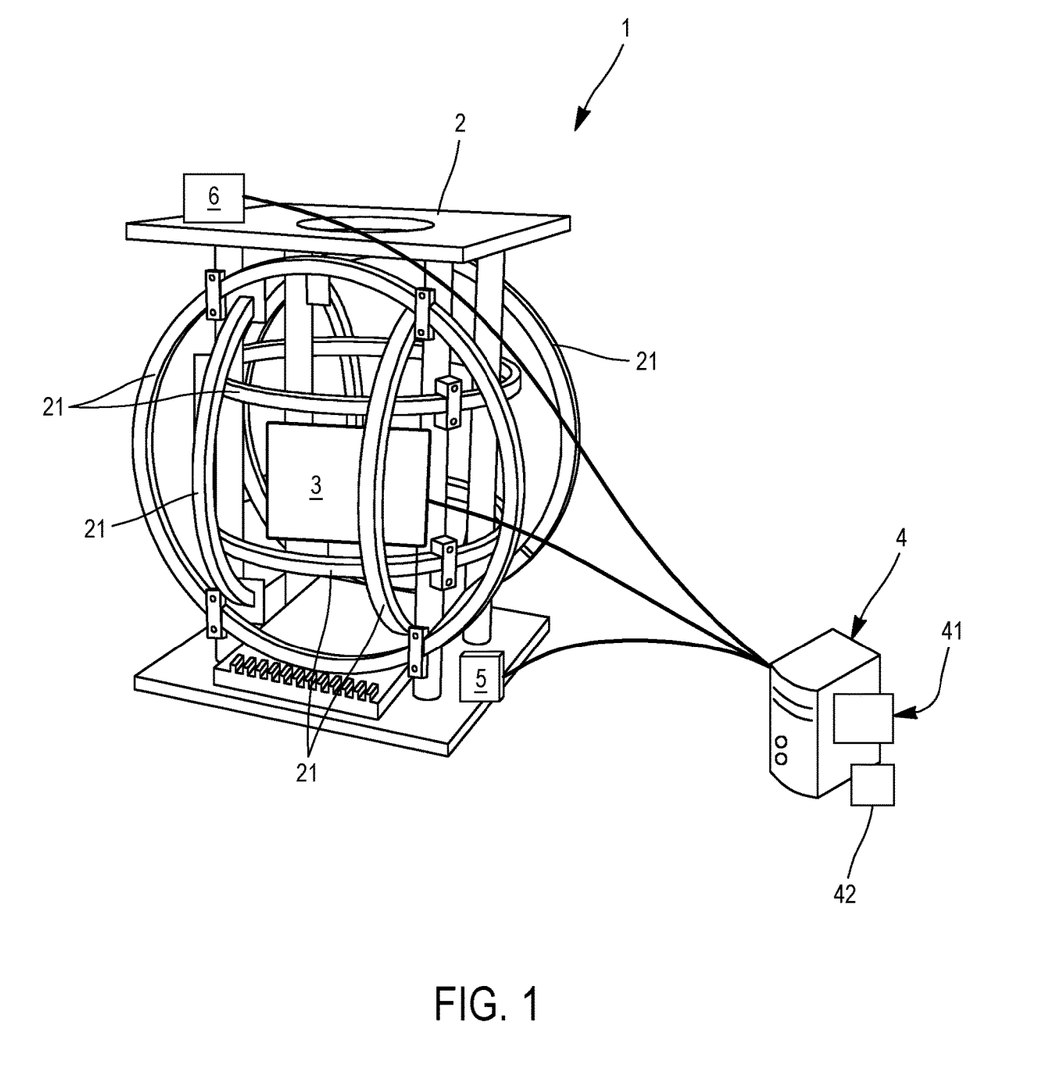
FIG. 1 is a diagram representing a possible alternative of an equipment for the implementation of the method according to the invention.

With reference to FIG. 1, an equipment 1 for calibrating at least one magnetometer 3 includes:

a generator 2 of a magnetic field including windings 21. The generator 2 generates a magnetic field when electric currents circulate in the windings 21. In the alternative represented in FIG. 1, the generator 1 is a device with triaxial Helmholtz coils including six windings 21. The at least one magnetometer 3 to calibrate, generally speaking a plurality of magnetometers 3 arranged on a support (such as for example an electronic card), is arranged inside the generator 2. In the alternative illustrated in FIG. 1, the magnetometer(s) 3 to calibrate are arranged between the windings 21 of the generator 2 with Helmholtz coils.

processing means 4, for example a computer, which include a processor 41 and a memory 42 and which are configured to implement a method according to the invention. The processing means 4 are connected to the generator 2 and to said at least one magnetometer 3. The processing means 4 can thereby control the electric currents in the windings 21 of the generator 2, and obtain the data measured by the magnetometer(s) 3.

a current sensor 5 configured to measure the electric current in each of the windings 21 of the generator. The current sensor 5 is connected to the processing means 4.

The equipment 1 may also include means for controlling 6 the temperature of the at least one magnetometer 3. Indeed, the magnetometers may be temperature sensitive. It is thereby advantageous to maintain the magnetometer(s) 3 to calibrate at the desired temperature with the means for controlling 6 the temperature of said at least one magnetometer 3. Typically, the temperature control means 6 may impose that the temperature inside the generator 2 remains constant, for example with heating means and/or cooling means, such as for example a heating resistance or a heat pump.

Method

Figure 2:
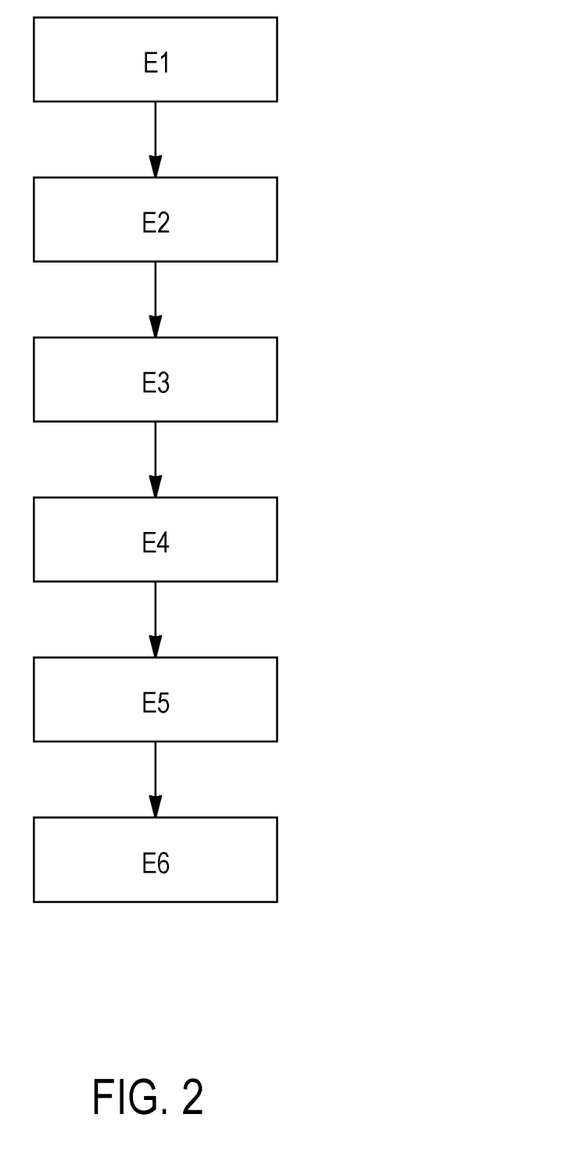
FIG. 2 represents a possible embodiment of the method according to the invention.

As illustrated in FIG. 2, the method for calibrating the at least one magnetometer 3 includes the following steps:

E1: placing at least one magnetometer 3 to calibrate inside the magnetic field generator 2;

E2: generating a magnetic field in the generator 2 by applying electric currents to the different windings 21 of said generator 2;

E3: measuring the magnetic field generated in the generator 2 with the at least one magnetometer 3, and measuring the electric currents applied to the windings 21 of the generator 2 with the current sensor 6;

E4: repeating step E3 (measuring said magnetic field as well as the electric currents in the coils) by modifying each time a position of said at least one magnetometer 3 inside the generator 2, and/or the electric currents in the windings 21 of the generator 2. A measurement of the magnetic field and the currents applied to the windings 21 being obtained for each location of the magnetometer 3 and/or variation in the electric currents in the windings 21. Typically, a series of 36 measurements may be carried out with two monoaxial magnetometers 3, or 18 with a triaxial magnetometer 3, by changing the position of the magnetometers 3 and/or the electric currents in the windings 21 between each measurement. The variation in the electric currents in the windings 21 may for example be done by a variation in the intensity and/or a variation in the voltage. The fact of varying the position of the at least one magnetometer 3 and/or the currents in the windings 21 makes it possible to obtain measurements in different conditions in order to be able to be used for an optimisation algorithm.

E5: generating a parametric transfer model from a parametric measurement model of said at least one magnetometer 3 and a parametric model of the magnetic field, the parametric measurement model of said at least one magnetometer including the parameters for calibrating said at least one magnetometer 3.

E6: calculating the parameters for calibrating the at least one magnetometer 3 with an optimisation algorithm from the parametric transfer model generated at step E5, and measurements of the magnetic field and the currents for the different locations of said at least one magnetometer 3 obtained during steps E3 and E4. The optimisation algorithm may be a gradient descent, a Levenberg-Marquardt algorithm, or a Metropolis-Hastings algorithm.

The optimisation algorithm is initialised by generating the parametric transfer model. A cost function is next evaluated from the measurements of currents in the windings 21 and measurements of the magnetic field by the at least one magnetometer 3. A value of the parameters for calibrating the magnetometer, as well as other parameters of the parametric model, is determined in order to reduce the cost function.

Figure 3:
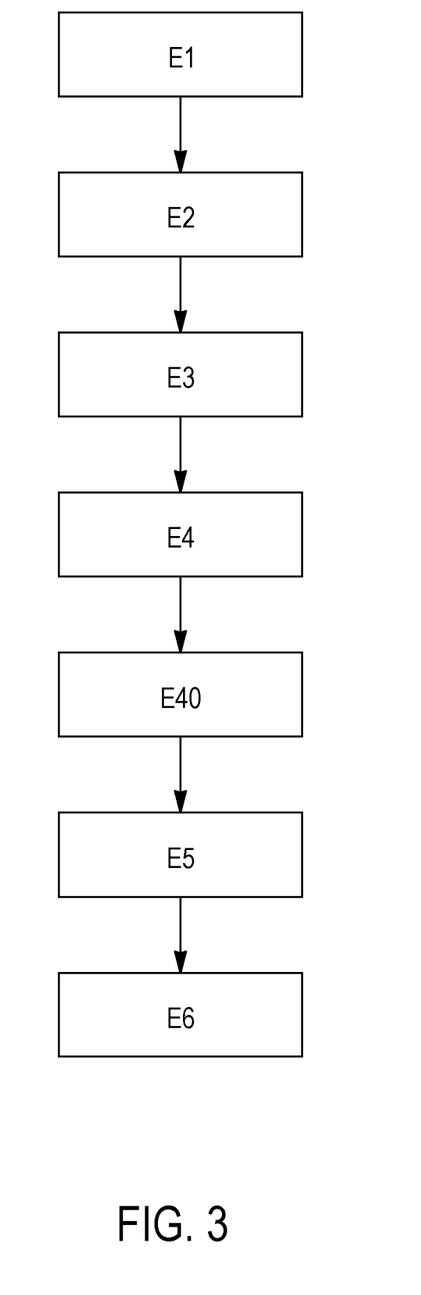
FIG. 3 represents a possible alternative of the method according to the invention.

According to an alternative illustrated in FIG. 3, the method may include a step E40 for calculating a measured transfer model between the generated magnetic field and the electric currents applied to the windings 21 for the different positions of said at least one magnetometer 3 and/or the different electric currents in the windings, from on the one hand measurements of said magnetic field and on the other hand measurements of said electric currents applied to the windings 21.

The calculation of a transfer matrix from the measurements may for example be carried out by linear regression. Other methods may also be used to calculate the transfer model and thereby describe the link between the measurements of the magnetic field and the currents in the windings 21, such as for example with a polynomial model, or a Fourier series model, which are suitable methods if the response of the magnetometers 3 is not linear.

In this alternative, the calculation of the calibration parameters of step E6 is carried out with an optimisation algorithm from the parametric transfer model and the measured transfer models. The steps of evaluation of a cost function and determination of the calibration parameters reducing this cost function are repeated with the measured transfer models of the different positions of the magnetometer in the generator, until finding a local or global minimum.

This method thus also makes it possible to determine the parameters of a magnetic field model, said parameters being comprised in the parametric model of the magnetic field.

It will now be described how it is possible to calculate the parameters for calibrating the magnetometer(s) 3, and the parameters for calibrating the magnetic field generated by the generator 2 with such a method.

The magnetic field generated by the generator 2 is an affine function with respect to the electric currents circulating in the windings 21 of said generator.

Thus, if B(X) denotes the magnetic field as a function of the position X inside the generator 2, it is possible to write:

$$B(X) = T(X)\vec{I}$$

where $\vec{I}$ is a vector including the list of all the independent electric currents in each so winding 21, and where T(X) designates a transfer matrix (a transfer model in the case of a linear magnetometer).

The electric currents are measured by the current sensor 6, which transmits the measured data to the processing means 4.

The magnetic field at each point is thus obtained by linear combination of the electric currents in each winding 21 through the transfer matrix T (X).

A magnetometer 3 typically supplies a measurement of the magnetic field in a given direction. When a magnetometer 3 is positioned immobile near to the windings 21, the magnetic field measured by said magnetometer 3 may thus be expressed as a function of the currents $\vec{I}$, and calibration parameters including for example the location X of said magnetometer 3 on the support on which said magnetometer 3 is placed, the directional measurement factor of the magnetometer (which includes the scale parameter of said magnetometer 3), and the bias of said magnetometer 3.

In Helmholtz coils (and in other configurations of generator with windings such as those of Maxwell or Braunbek type coils) it is possible to show theoretically that two sets of physically equivalent measurements can only be distinguished by the choice:
  of an origin of the point of reference of the windings 21;
  of a definition of the axes of the point of reference of the windings 21;
  of a scale factor on the magnetic field emitted by the windings 21;
  of a scale factor on the lengths.

These choices may be written in the form of constraints on the identified parameters. For example, the scale factor on the magnetic field emitted by the windings 21 may be defined by imposing the scale factor of a magnetometer, or by imposing a field value at the origin of the generator 2.

For a plurality of monoaxial magnetometers 3, with linear response (the method of the invention applies however to other models of magnetometers, such as for example magnetometers with non-linear models), which are fixed in a rigid manner on their support, such as for example an electronic card (called sensor card) which is mounted on an object, said magnetometers 3 being considered as punctual and assumed without bias, it is possible to define the following parametric measurement model (or calibration model) for each magnetometer 3:

$$Y^i(X) = \Sigma_j d_j^i C^j(x) \qquad (1)$$

Where $Y^i(X)$ represents the scalar measurement of the magnetometer i when it is placed at the point X, and $C^j(X)$ represent the three components of the magnetic field at the point X, and where $d_j^i$ represents a directional measurement factor associated with the magnetometer i.

The directional measurement factor $d_j^i$ is a parameter for calibrating the magnetometer which includes several items of information on the magnetometer. Indeed, the directional measurement factor indicates on the one hand the manner in which the magnetometer measures the different components of the magnetic field, and on the other hand the scale factor of the magnetometer. For example, if: $d^i = (1 + \in_X; \in_Y; \in_Z)$, with $\in_X, \in_Y, \in_Z \ll 1$ then the associated magnetometer is a sensor measuring globally the direction X of the magnetic field and suffers from a problem of axial scale factor with respect to X ($\in_X$) and a problem of alignment with respect to the axes Y ($\in_Y$) and Z ($\in_Z$). Those skilled in the art will know how to extend this model to the case of a bias or non-linearities.

In addition, the following relationship moreover exists:

$$C^j(X) = \Sigma_k S_k^j B^k \qquad (2)$$

where S represents the transpose of the attitude matrix Q of the sensor card on which are mounted the magnetometers 3.

Thus, in the case where the magnetic field is generated by a generator 2 with Helmholtz coils with six windings 21, as is the case in the alternative illustrated in FIG. 1, the following is obtained:

$$B^k(X) = \Sigma_m T_m^k(X,\mu) I^m \qquad (3)$$

where $T_m^k(X, \mu)$ represents the parametric model of the magnetic field, here in this case in the form of a transfer matrix, between the magnetic field generated by the generator 2 and the currents in the six windings 21, and where $I^m$ corresponds to the electric current in the winding m. The parametric model of the magnetic field $T_m^k(X, \mu)$ depends on a set of parameters which are gathered together in the vector µ. The vector µ includes the parameters for calibrating the magnetic field obtained during step E6.

In addition, the following relationship may be established:

$$X[a,p]^i = O[p]^i + \Sigma_j Q[p]_j^i P[a]^j \qquad (4)$$

Where $O[p]^i$ is the i-th coordinate in the point of reference of the generator 2 of the origin of the sensor point of reference during its p-th location in the generator 2. The sensor point of reference is a point of reference making it possible to determine the location of the magnetometers 3 in a relative manner using one of the magnetometers 3 as reference, thereby forming the origin of the sensor point of reference, where Q[p] is the attitude matrix of the magnetometers 3, the attitude matrix giving the orientation of the magnetometers 3, where $P[a]^j$ is the j-th coordinate in the sensor point of reference of the magnetometer a, and where X[a, p] is the position of the magnetometer a during its p-th location in the generator 2.

Thus, the following parametric measurement model is obtained for the magnetometers 3:

$$Y^i(X[i,p]) = \Sigma_j \Sigma_k \Sigma_m d_j^i S[p]_k^j T_m^k(O[p]^n + \Sigma_o Q[p]_o^n P[i]^o, \mu) I^m \quad (5)$$

Where $Y^i(X[i,p])$ represents the scalar measurement of the magnetometer i during its p-th location in the generator 2.

The measured transfer matrix during the pth location of the magnetometers 3 in the generator 2 is defined in the following manner:

$$H[p] = (H_m^i(X[i,p]))_{1 \leq i \leq nb\ magnetometers, 1 \leq m \leq 6} \quad (6)$$

Where i here corresponds to the number of magnetometers 3 on the sensor card to calibrate, where p corresponds to the number of locations of the sensor card including the magnetometers 3 in the generator 2, and where m corresponds to the number of windings 21 of the generator 2.

The following equation is thus obtained:

$$H_m^i(X[i,p]) = \Sigma_j \Sigma_k d_j^i S[p]_k^j T_m^k(O[p]^n + \Sigma_o Q[p]_o^n P[i]^o, \mu) \quad (7)$$

The matrix $H_m^i(X[i, p])$ is the transfer matrix which is determined during step E4, and more precisely during the p-th implementation of step E4 by the method.

How the measured transfer models may be calculated will now be detailed. By arranging a series of N samples of simultaneous measurements of the magnetic field by n magnetometers: $(y_i(t_j))_{1 \leq i \leq n, 1 \leq j \leq N}$.

These measurements depend linearly at each instant on p variables which represent the measurements of the electric currents in the windings of the generator: $(x_k(t_j))_{1 \leq k \leq p, 1 \leq j \leq N}$. One thus obtains for any i, j:

$$y_i(t_j) = f_i(x_1(t_j), x_2(t_j), \ldots, x_p(t_j)) \quad (8)$$

For linear cases:
The functions, or transfers $f_i$ are linear functions of $(x_1(t_j), x_2(t_j), \ldots, x_p(t_j))$.

That is to say that it is possible to write $y_i(t_j)$ linear combinations of $(x_1(t_j), x_2(t_j), \ldots, x_p(t_j))$:

$$y_i(t_j) = T_{i,1} x_1(t_j) + T_{i,2} x_2(t_j) + \ldots + T_{i,p} x_p(t_j) \quad (9)$$

The matrix $T = (T_{i,k})_{1 \leq i \leq n, 1 \leq k \leq p}$ is the transfer matrix linking the measurements y to the variables x.

To calculate T, it suffices to know the values $y_i(t_j)$ when the p temporal sequences $x_k(t_j)$ are linearly independent (no temporal sequence $x_k(t_j)$ is obtained by linear combination of the p-1 others).

Example with for p=2:

$$(x_1(t_1), x_1(t_2)) = (1, 0)$$

$$(x_2(t_1), x_2(t_2)) = (0, 1) \quad (10)$$

One then obtains:

$$(y_i(t_1), y_i(t_2)) = (T_{i,1} x_1(t_1) + T_{i,2} x_2(t_1), T_{i,1} x_1(t_2) + T_{i,2} x_2(t_2)) = (T_{i,1}, T_{i,2}) \quad (11)$$

Consequently, from the values of $(y_i(t_1), y_i(t_2))$ and $(x_1(t_1), x_i(t_2))$ the values of the coefficients $T_{i,1}, T_{i,2}$ are immediately deduced.

In other words, assuming that the measured quantity y (magnetic field measurement) depends linearly on x (current measurement), it suffices to excite the system by modifying x (the current) to identify the relationship between y and x, for example by linear regression. The condition for the identification to be possible, is notably by linear regression, is the linear independence between the different $x_k$ throughout the recording (the currents are linearly independent).

For the affine case (particular case for the linear):

$$y_i(t_j) = T_{i,1} x_1(t_j) + T_{i,2} x_2(t_j) + \ldots + T_{i,p} x_p(t_j) + b_i \quad (12)$$

is equivalent to the linear case, since it suffices to define $x_{p+1}(t_j) = 1$:

$$y_i(t_j) = T_{i,1} x_1(t_j) + T_{i,2} x_2(t_j) + \ldots + T_{i,p} x_p(t_j) + b_i x_{p+1}(t_j) \quad (13)$$

The coefficient $b_i$ is then calculated as a new coefficient of a transfer matrix.

The linear or affine regressions are also called linear or affine interpolations.

For the non-linear cases:
The functions, or transfers $f_i$ are non-linear functions of:

$$(x_1(t_j), x_2(t_j), \ldots, x_p(t_j)) \quad (14)$$

It is possible, for example, to make the hypothesis that these functions are polynomial with several variables. Identifying the functions $f_i$ in this form thus comes down to carrying out a polynomial interpolation.

For example, for a second order interpolation, for any i and j one has:

$$y_i(t_j) = \sum_{1 \leq k \leq p} T_{i,k} x_k(t_j) + \sum_{1 \leq k_1 \leq k_2 \leq p} T_{i,k_1,k_2} x_{k_1}(t_j) x_{k_2}(t_j) \quad (15)$$

The coefficients $T_{i,k}$ and $T_{i,k_1,k_2}$ are deduced from the knowledge of $y_i(t_j)$ and $x_k(t_j)$ by polynomial regression from the above equation, subject to choosing the $x_k(t_j)$ such that the system is correctly conditioned.

For Helmholtz coils, the magnetic measurement $y_i(t_j)$ is a function (linear or not) of the magnetic field at the actual position of the magnetometer i at the sampling pitch $t_j$ by a measurement model.

As long as the magnetometer is maintained immobile, this magnetic field only depends on the currents that will be noted $I_k(t_j)$, which dependence is linear on account of the laws of physics.

Consequently, by exciting the system by suitably varying $I_k$ as a function of time, one is capable of interpolating (linearly or not) the function linking the measurement to the currents, corresponding to the transfer model from the measurements. Furthermore, if the position and the orientation of the magnetometer is known, that the windings are calibrated and that the sensor is calibrated, it is possible to predict the transfer model that has to be obtained. It is then possible, by an optimisation method, to deduce the measurement model, the calibration model of the windings, and the position and the orientation of the magnetometer during the immobility phase having made it possible to calculate the transfer model.

By comparing the measured transfer models and the parametric transfer model, it is possible to find a unique solution for the parameters for calibrating the magnetometers 3 (which are here: $d_j^i$, $P[i]^o$) as well as for the vector $\mu$ including the parameters for calibrating the magnetic field of the generator 2.

These parameters may be determined for example by using a gradient descent algorithm in order to resolve, for said parameters to determine, the equation system associated with the set of measured transfers. This comes down to minimising the quadratic sum of the deviations between the parametric transfer matrix and the measured transfer matrices.

The parameters $Q[p]_o''$ and $O[i]^o$, respectively the attitude matrix corresponding respectively to the orientation and the location of the magnetometers in the generator are also identified. These are sub-products of the identification which do not contribute to the calibration of the magnetic system, but which are necessary to correctly pose the problem of optimisation.

One of the advantages of the proposed method is not to require prior calibration or standardisation of the calibration device, and thus of the generator 2. Indeed, the method enables, simultaneously to the calculation of the parameters for calibrating the magnetometer 3, the adjustment of a parametric model of the magnetic field in the zone where the device to calibrate is positioned.

Furthermore, if the parametric model of the magnetic field used is sufficiently fine, inhomogeneities of the magnetic field may be detected during the method for calibrating the magnetometers. Thus, it is possible to use a device with Helmholtz coils without being restricted uniquely to using the central zone of the device in which the generated magnetic field is homogeneous.

As parametric model of the magnetic field, the following models may for example be used:

an affine field model (first order), such as for example:

$$B(X,\mu)=B_0+\nabla B_0(X-X_0) \quad (16)$$

Where $\nabla B_0$ is a symmetric gradient with zero trace. The model parameters to identify are then $\mu=(B_0, \nabla B_0)$, i.e. the three components B and the five independent components of $\nabla B_0$.

a second order field model, such as for example:

$$B(X,\mu) = B_0 + \nabla B_0(X-X_0) + \begin{pmatrix} (X-X_0)^T H_x (X-X_0) \\ (X-X_0)^T H_y (X-X_0) \\ (X-X_0)^T H_z (X-X_0) \end{pmatrix} \quad (17)$$

Where $\nabla B_0$ is a symmetric gradient with zero trace and where Hx, Hy and Hz are symmetric Hessians with zero trace. The model parameters to identify are then $\mu=(B_0, \nabla B_0, H_x, H_y, H_z)$, i.e. the three components of B, the five independent components of $\nabla B_0$, and the components of the Hessian ($H_x, H_y, H_e$).

a model of finite elements type.

$T_m^k(X, \mu)=B(X, \mu)/I_0$ could be taken according to one or the other of the models, with $I_0$ a mute constant in the problem making it possible to ensure that the variables have the correct units.

Furthermore, the bias of the magnetometers 3 is also a calibration parameter being able to be measured by the calibration method described previously. According to another possible alternative, the bias of the magnetometers 3 is measured by measuring the magnetic field measured by said magnetometers 3 when said magnetometers 3 are arranged in a device (also called zero Gauss chamber) inside of which the magnetic field is zero.

Furthermore, it is possible to only determine certain parameters for calibrating the magnetometer(s) 3 and/or parameters for calibrating the magnetic field when only these calibration parameters are considered as sufficient for the desired application. It is thereby possible to assume calibration parameters of which it is not wished to calculate the value as known.

Depending on the type of magnetometer 3 used, the magnetometer(s) 3 may be maintained immobile inside the generator 2 during the measurement steps between each change of position. It may however not be necessary to maintain the magnetometer(s) 3 immobile by using electric currents with a sufficiently high frequency, typically frequencies greater than 1 kHz, and for example 10 kHz.

For magnetometers 3 having a non-linear measurement model, it is possible to determine the calibration parameters by adapting the current profile, that is to say by adapting the intensity and the frequency of the current in each of the windings 21 of the generator 2.

Furthermore, an optimisation algorithm for a case not using measured transfer models (no step E40) is detailed below.

For each set p of current and position, it is possible to combine equations (5) and (16) to give an example in a more general case which gives, for each magnetometer i:

$$Y^i(\text{param},I^m[p],O[p],Q[p])=\Sigma_j\Sigma_k\Sigma_m d_j{}^i S[p]_k{}^j(B_0+\nabla B_0(O[p]''+\Sigma_o Q[p]_o''P[i]^o-X_0))I^m \quad (18)$$

with param=$(\{P[i]\}_i, \{d^i\}_i, B_0, \nabla B_0)$

The optimisation problem may thus be written as a function of the measurements $Y_{measured}^i[p]$ of the magnetic field by the magnetometers 3 and the measurements $I_{measured}^m[P]$ of the electric currents in the windings 21 in the following forms form 1:

$$\underset{param,\{O[p]\}_p,\{Q[p]\}_p}{\mathrm{argmin}} \sum_p \sum_i \|Y_{measured}^i[p] - Y^i(param, I_{measured}^m[p], O[p], Q[p])\|^2 \quad (19)$$

where $\| \ \|$ is a norm (L1, L2 or other)

form 2:

$$\underset{param,\{O[p]\}_p,\{Q[p]\}_p,\{I\_[p]\}_p,\{Y\_[p]\}_p}{\mathrm{argmin}} \sum_p \sum_i \alpha\|Y_{measured}^i[p] - Y\_[p]\|^2 + \quad (20)$$

$sc.Y\_[p]-Y^i(param,I\_[p],O[p],Q[p])$ $$\beta\|I_{measured}^m[p] - I\_[p]\|^2$$

where $\alpha$ and $\beta$ are dimensional parameters.

Computer Programme Product

According to a third and a fourth aspect, the invention relates to a computer programme product including code instructions for the execution (on the processing means 40) of a method for calibrating at least one magnetometer 3 according to any of the possible alternatives of the invention, as well as storage means readable by a computer equipment (for example the memory 42) on which this computer programme product is found.

Calibration of the Generator

According to another aspect, the invention makes it possible to standardise the generator 2, notably by measuring the shape and the size of the zone in which the magnetic field generated by the generator 2 is homogeneous.

The parametric model of the magnetic field theoretically gives in effect the size and the shape of the zone in which said magnetic field is homogeneous.

The invention makes it possible to improve this parametric model using the parameters for calibrating the magnetic field measured at the same time as the parameters for calibrating the magnetometers 3. With this improved parametric model, it is possible to determine the size and the real shapes of the zone in which said magnetic field is homogeneous.

Yet, the shape and the size of the zone in which the magnetic field is homogeneous depends on mechanical parameters of the generator 2, such as for example the shape of the windings 21, the relative orientation of said windings 21, as well as parameters linked to the electronics of the generator 2, such as for example the stability of the electrical power supplies.

Thus, thanks to the invention, it is thus possible to determine the mechanical and electronic parameters of the generator 2 responsible for the defects that the generated magnetic field has, thereby making it possible to standardise the generator 2.

The invention claimed is:

1. Method for calibrating at least one magnetometer comprising:
    E1: placing at least one magnetometer inside a generator of a magnetic field, said generator including a plurality of windings;
    E2: generating a magnetic field in the generator by applying electric currents to the different windings;
    E3: measuring the magnetic field generated in the generator with said at least one magnetometer, and measuring the electric currents applied to the windings of the generator;
    E4: repeating step E3 by modifying each time a position of said at least one magnetometer inside the generator and/or the electric currents in the windings of the generator so as to obtain measurements of the magnetic field and the electric currents applied to the windings for a plurality of positions of said at least one magnetometer and/or electric currents in the windings;
    E40: calculating a measured transfer model between the measurement of the magnetic field by the at least one magnetometer and the electric currents applied to the windings for the different positions of said at least one magnetometer and/or the different electric currents in the windings, from on the one hand measurements of said magnetic field and on the other hand measurements of said electric currents applied to the windings;
    E5: generating a parametric transfer model from a parametric measurement model of said at least one magnetometer and a parametric model of the magnetic field, the parametric measurement model of said at least one magnetometer including parameters for calibrating said at least one magnetometer;
    E6: calculating the parameters for calibrating the at least one magnetometer with an optimisation algorithm from the parametric transfer model generated at step E5, the measured transfer models calculated at step E40, and the measurements of the magnetic field and the electric currents carried out in steps E3 and E4.

2. Method according to claim 1, wherein the method further includes a step of controlling the temperature of said at least one magnetometer to calibrate.

3. Method according to claim 1, wherein the at least one magnetometer has a linear response, the measured transfer model being a measured transfer matrix which is calculated by linear regression, the parametric transfer model being a parametric transfer matrix.

4. Method according to claim 1, wherein the at least one magnetometer has a non-linear response, the measured transfer model being calculated with a polynomial model or a Fourier series model.

5. Method according to claim 1, wherein the generator is a device with triaxial Helmholtz coils including six windings.

6. Method according to claim 1, wherein the method includes a step of identification of a bias of said at least one magnetometer, the identification step being carried out by placing said at least one magnetometer in a device isolating said at least one magnetometer (3) from any magnetic field.

7. Method according to claim 1, wherein the method is applied to a plurality of magnetometers, the parameters for calibrating the magnetometers including a location of the magnetometers defined with respect to one of the magnetometers serving as reference.

8. Method according to claim 1, wherein said at least one magnetometer is maintained fixed during step E2 of generation of the magnetic field inside the generator and during step E3 of measurement of the magnetic field and the electric current applied to each of the windings.

9. Method according to claim 1, wherein the parameters for calibrating the at least one magnetometer include: a position of said at least one magnetometer on a support on which said at least one magnetometer is mounted, a directional measurement factor of said at least one magnetometer, and/or a bias of said at least one magnetometer.

10. Method according to claim 1, wherein the parametric model of the magnetic field is a first order field model, a second order field model, or a finite elements model.

11. Equipment for calibrating at least one magnetometer including at least a magnetometer, a generator of a magnetic field which includes a plurality of windings, a current sensor configured to measure the current in each of the windings, and a processor which are configured to:
    generate a parametric transfer model from a parametric measurement model of said at least one magnetometer and a parametric model of the magnetic field, the parametric measurement model of said at least one magnetometer including parameters for calibrating said at least one magnetometer;
    calculate a measured transfer model between the measurement of the magnetic field by the at least one magnetometer and the electric currents applied to the windings for the different positions of said at least one magnetometer and/or the different electric currents in the windings, from on the one hand measurements of said magnetic field and on the other hand measurements of said electric currents applied to the windings;
    calculate the parameters for calibrating the at least one magnetometer with an optimisation algorithm from the parametric transfer model, the calculated measured transfer models and measurements of the magnetic field by said at least one magnetometer and measurements of currents in the windings.

12. Computer programme product including code instructions for the execution of a method for calibrating at least one magnetometer according to claim 1, when said programme is executed on a computer.

13. Non-transitory storage means readable by a computer equipment on which a computer programme product includes code instructions for the execution of a method for calibrating at least claim 1.

* * * * *